US005896047A

United States Patent [19]
Zhou

[11] Patent Number: 5,896,047
[45] Date of Patent: Apr. 20, 1999

[54] BALANCED TRUTH-AND-COMPLEMENT CIRCUIT

[75] Inventor: Shi-dong Zhou, Milpitas, Calif.

[73] Assignee: Xilinx, Inc., San Jose, Calif.

[21] Appl. No.: 08/795,219

[22] Filed: Feb. 5, 1997

[51] Int. Cl.$^6$ .................................................. H03K 19/094
[52] U.S. Cl. ............................ 326/119; 326/83; 327/408
[58] Field of Search ........................... 326/104, 108, 326/27, 81, 83, 86, 121, 119; 327/407, 408

[56] References Cited

U.S. PATENT DOCUMENTS

| 4,296,339 | 10/1981 | Murotani | 326/83 |
| 5,218,247 | 6/1993 | Ito et al. | 326/83 |
| 5,448,181 | 9/1995 | Chiang | 326/83 |
| 5,523,971 | 6/1996 | Rao | 365/187.07 |
| 5,541,541 | 7/1996 | Salamina et al. | 326/83 |
| 5,657,290 | 8/1997 | Churcher | 365/205 |
| 5,761,483 | 6/1998 | Trimberger | 326/40 |

*Primary Examiner*—Jon Santamauro
*Assistant Examiner*—Don Phu Le
*Attorney, Agent, or Firm*—Edel M. Young; LeRoy D. Maunu, Esq.

[57] ABSTRACT

A balanced truth-and-complement circuit. A driver circuit which generates a signal and its complement in response to an input signal; a switching circuit selects between the signal and its complement in response to external control signals; and a sense amplifier detects and amplifies the signal selected by the switching circuit. The driver circuit has NMOS transistors and inverters arranged so as to connect either the signal or its complement to the switching circuit.

9 Claims, 3 Drawing Sheets

BALANCED TRUTH-AND-COMPLEMENT CIRCUIT

FIELD OF THE INVENTION

The present invention relates generally to a circuit for reducing noise in and increasing the speed of electrical circuits, and more particularly to using a balanced truth-and-complement circuit to reduce the noise in and increase the speed of a Programmable Logic Device (PLD).

BACKGROUND OF THE INVENTION

Programmable Logic Devices (PLDs) are widely used in the field of digital circuitry and are typically comprised of an array of driver circuits and AND-arrays that can be re-configured to perform many different Boolean equations. To implement a particular Boolean equation, a PLD typically receives several input signals. Each input signal is fed into one or more sets of driver circuits and AND-arrays within the PLD. The driver circuits and AND-arrays respond to the input signals and generate one or more output signals.

One of the ways in which driver circuits and AND-arrays can be re-configured is into a truth-and-complement circuit. A truth-and-complement circuit either generates an output signal equal to an input signal or generates an output signal equal to a complement of the input signal. For example, if signal "A" is input into the driver circuits, then the truth-and-complement circuit may be programmed to output either A, or its complement, Ā. The output signal is transmitted on a bit-line.

A sense amplifier detects the output signal and boosts it before passing it to another portion of the PLD. The sense amplifier either outputs a logic "1" or a logic "0" depending upon the voltage it detects on the bit-line. The difference between a first voltage on the bit-line which causes the sense amplifier to generate a logic "1" and a second voltage on the bit-line which causes the sense amplifier to generate a logic "0" is called a "voltage differential" of the sense amplifier.

The speed of a sense amplifier is inversely proportional to the voltage differential and necessarily affects the PLD's maximum speed. For instance, a sense amplifier with a large voltage differential requires more time to accumulate charge before it switches from logic "0" to logic "1." As a result, the sense amplifier operates more slowly, and therefore the operational speed of the PLD is reduced. Conversely, if the sense amplifier has a small voltage differential, the sense amplifier charges and discharges more quickly and thus enables the PLD to operate at a faster speed. Thus, it is very desirable that the voltage differential be as small as possible.

The size of the required voltage differential depends upon a noise voltage present on the bit-line. The voltage differential must be greater than the noise voltage on the bit-line so that the sense amplifier does not misinterpret the noise voltage as the input signal. Thus, the noise voltage limits the PLD's maximum speed.

One of the contributors to the noise voltage on the bit-line is the driver circuit. Present driver circuits add to the noise voltage on the bit-line due their path delay differences between their truth output and complement output. The truth output is a line which transmits the input signal without any logic modifications. The complement output is a line which transmits the complement of the input signal. The path delay difference is created when an extra inverter is placed within one of the paths, thereby causing the complement of the input signal to be output at a slightly later time than the signal itself. Since both the truth and the complement outputs are coupled to the bit-line via undesirable parasitic capacitances, even when the AND-arrays are not programmed to connect either signal to the bit-line, the signals add to the noise voltage on the bit-line.

Therefore, what is needed is an improved truth-and-complement circuit which generates a smaller noise voltage on the bit-line.

SUMMARY OF THESE INVENTION

The present invention is a balanced truth-and-complement circuit. Within the truth-and-complement circuit of the present invention, a balanced driver circuit includes a first signal path coupled to receive an input signal from an input terminal and to generate a first output signal on a first output terminal after a first path delay. The first signal path sets the first output signal equivalent to the input signal. The balanced driver circuit also includes a second signal path that is coupled to receive the input signal from the input terminal and to generate a second output signal on a second output terminal after a second path delay. The second signal path sets the second output signal equivalent to a complement of the input signal. The second path delay is substantially equal to the first path delay (i.e. it is "balanced") and thus noise voltages within the truth-and-complement circuit are reduced.

In another aspect of the invention, the first signal path includes a first transistor coupled to the input terminal and the first output terminal for connecting a logic "1" signal to the first output terminal when the input signal is set to a logic "1", and a second transistor coupled to the input terminal and the first output terminal for connecting a logic "0" signal to the first output terminal when the input signal is set to a logic "0". The second signal path includes a third transistor coupled to the input terminal and the second output terminal for connecting a logic "0" signal to the second output terminal when the input signal is set to a logic "1", and a fourth transistor coupled to the input terminal and the second output terminal for connecting a logic "1" signal to the second output terminal when the input signal is set to a logic "0".

In still another aspect of the invention, the circuit includes a bit-line and a switching circuit connecting the circuit to the bit-line and routing either the first output signal or the second output signal to the bit-line in response to external control signals. The circuit may also include a sense amplifier for detecting and amplifying the signals on the bit-line.

Truth-and-complement circuits containing the balanced driver circuit described above may operate taster than conventional truth-and-complement circuits since the path delays between the first path and the second path are substantially equal. When these path delays are substantially equal, any coupling by parasitic capacitances of the output signals to the bit-line does not result in as great a contribution to a noise voltage on the bit-line as would be if the path delays were different. With the noise voltage effectively lowered, the sense amplifier can operate at lower voltages, and in response circuits containing the circuit described above may operate at a higher speed.

These and other aspects of the invention will be recognized by those skilled in the art upon review of the detailed description, drawings, and claims set forth below.

DETAILED DESCRIPTION OF THE PREFERRED EMBODIMENT

Figure 1:
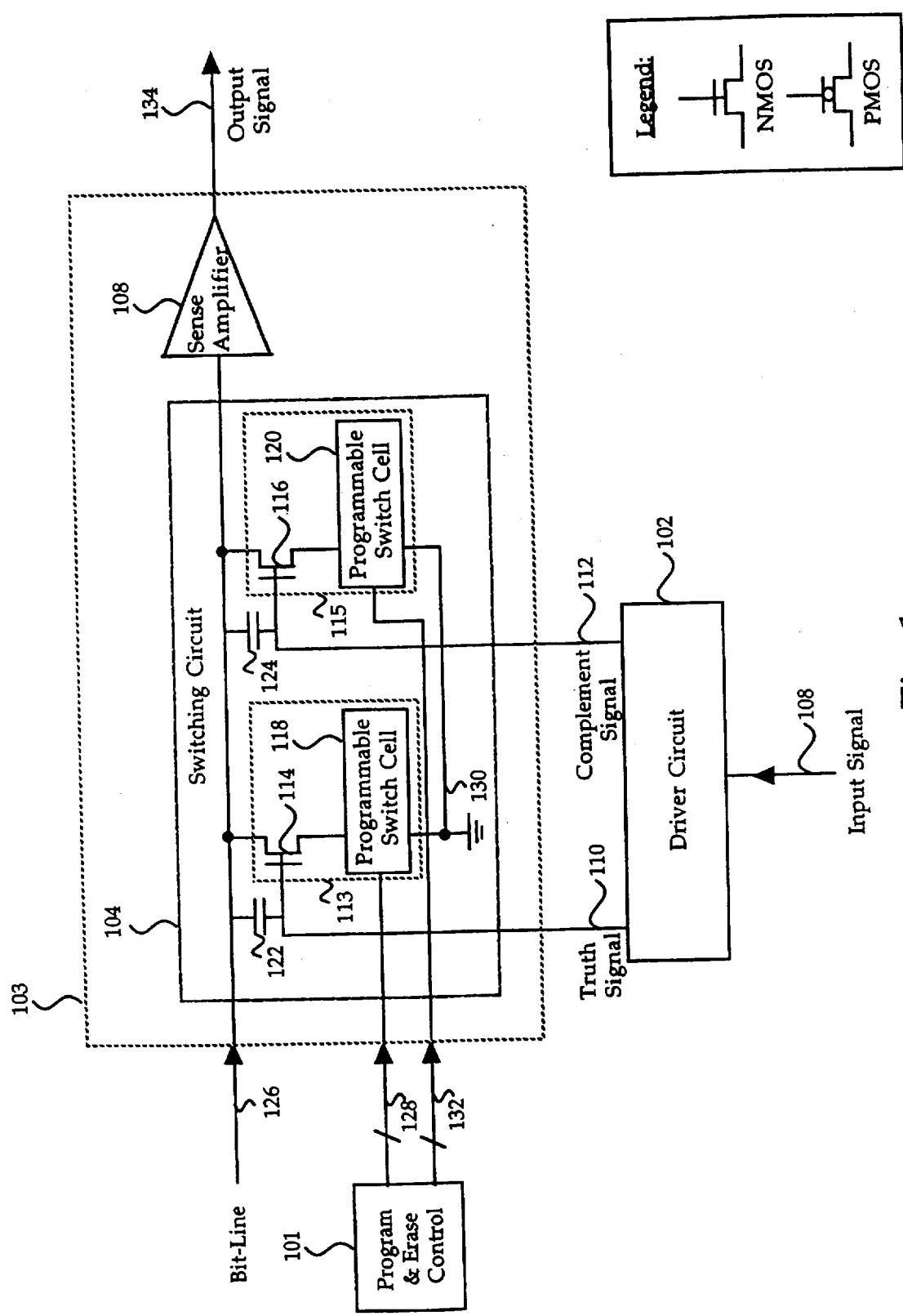
FIG. 1 is a block diagram of a truth-and-complement circuit in a programmable logic device.

FIG. 1 is a block diagram of a truth-and-complement circuit in a programmable logic device (PLD) (not shown). The circuit is comprised of a program and erase control 101, a driver circuit 102, and an AND-array 103.

Program and erase control 101 is coupled to AND-array 103 via buses 128 and 132. Operational characteristics of program and erase control 101 are discussed in more detail below in conjunction with AND-array 103.

Driver circuit 102 is coupled to line 108 to receive a input signal. Driver circuit 102 outputs a truth signal on line 110 and outputs a complement signal on line 112. The truth signal is logically equal to the input signal and the complement signal is logically opposite to the input signal. Driver circuit 102 is also coupled to an array of switching circuits (not shown), some of which are similar to the switching circuit 104. Driver circuit 102 is disclosed in more detail in FIGS. 2 and 3.

AND-array 103 is comprised of a switching circuit 104, and a sense amplifier 108. While not shown, AND-array 103 is typically further comprised of many additional switching circuits 104 that are also connected to bit-line 126.

Switching circuit 104 is comprised of two memory cells 113 and 115, and two parasitic capacitances 122 and 124. Each memory cell is comprised of an NMOS transistor 114,116, and a programmable switch cell 118, 120. Each transistor 114, 116 is comprised of a gate, an input, and an output.

Programmable switch cells 118, 120 are known in the art and are implemented in many different ways. Their basic function, however, which is to connect or disconnect elements within a circuit, remains the same. Program and erase control 101, which controls programmable cells 118, 120, is also known in the art. Switching circuit 104 may pass-through other input signals from other switching circuits (not shown) that are coupled to bit-line 126. Some of these other switching circuits are similar to switching circuit 104.

Parasitic capacitances 122, 124 are not actual devices, rather they represent an undesirable effect created during the manufacture of switching circuit 104. Parasitic capacitance 122 couples signals on line 110 to bit-line 126, and parasitic capacitance 124 couples signals on line 112 to bit-line 126. The coupling by the parasitic capacitances produces a noise voltage on bit-line 126.

The gate of transistor 114 is coupled to receive the truth signal on line 110, the input of transistor 114 is coupled to programmable switch cell 118, and the output of transistor 114 is coupled to bit-line 126. Programmable switch cell 118 is coupled to receive a truth enable/disable signal on bus 128 (which may be a single line or more than one line) from program and erase control 101, and to a ground terminal 130.

The gate of transistor 116 is coupled to receive the complement signal on line 112, the input of transistor 116 is coupled to programmable switch cell 120, and the output of transistor 116 is coupled to bit-line 126. Programmable switch cell 120 is coupled to receive a complement enable/disable signal on bus 132 from program and erase control 101, and to ground 130.

The truth enable/disable signal and the complement enable/disable signal along with other signals (not discussed because they are known in the art) received via the buses 128 and 132, control which of transistors 114, 116 are connected to ground 130. If one of transistors 114, 116 is connected to ground, then any signal on line 110 or 112 which turns on transistor 114 or 116 will in turn connect the bit-line 126 to ground 130.

The sense amplifier 108 is coupled to receive any signals being transmitted on bit-line 126. Sense amplifier 108 detects signals on bit-line 126 by monitoring the bit-line 126 voltage. Sense amplifier 108 outputs a first logic state (e.g. logic "0") on line 134 when bit-line 126 is not connected to ground and outputs a second logic state (e.g. logic "1") on line 134 when bit-line 126 is connected to ground.

When switching circuit 104 is not needed to affect the bit-line 126, neither the truth signal nor the complement signal should be connected to bit-line 126. In this case, program and erase control 101 sends a truth disable signal on bus 128, which disables programmable switch cell 118, and a complement disable signal on bus 128 which disables programmable switch cell 120.

However, when switching circuit 104 is needed for providing an input signal to bit-line 126 and the truth signal on line 110 is to be routed to bit-line 126, then program and erase control 101 enables programmable switch cell 118 and disables programmable switch cell 120. As a result, transistor 114 is connected to ground 130 and transistor 116 is not connected to ground 130. Under this configuration, each time a logic "1" is present on line 110, transistor 114 is turned on and bit-line 126 is connected to ground 130. This ground connection is detected as a voltage drop by sense amplifier 108 and a logic "1" is transmitted as the output signal on line 134.

Similarly, if the complement signal on line 112 is to be routed to bit-line 126, then program and erase control 101 disables programmable switch cell 118 and enables programmable switch cell 120. As a result, transistor 114 is not connected to ground 130 and transistor 116 is connected to ground 130. Under this configuration, each time a logic "1" is present on line 112, transistor 116 is turned on and bit-line 126 is connected to ground 130. This ground connection is again detected as a voltage drop by the sense amplifier 108 and a logic "1" is transmitted as the output signal on line 134.

Figure 2:
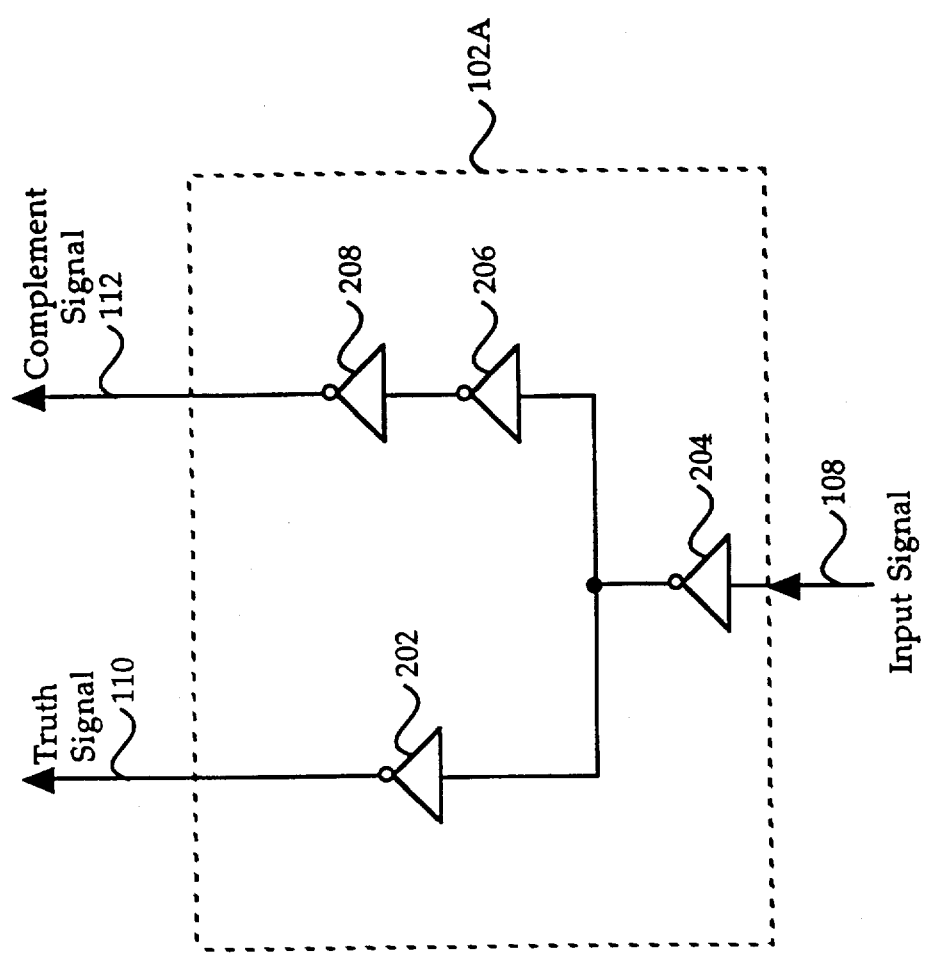
FIG. 2 is a prior art example of an un-balanced driver circuit in the truth-and-complement circuit of FIG. 1.

FIG. 2 is a prior art example of an un-balanced driver circuit 102A in the truth-and-complement circuit of FIG. 1. The prior art driver circuit 102A is comprised of four inverters 202, 204, 206, and 208. The input signal is received on line 108 by inverter 204 which inverts the signal. Inverter 204 passes the signal on two paths.

The first path routes the signal to inverter 202. The second path routes the signal to the pair of inverters 206 and 208. The end of the first path is connected to line 110 and the end of the second path is connected to line 112. On the first path the input signal is routed through two inverters and thus exits the driver circuit 102A on the line 110 in its original state as the truth signal. However, on the second path the input signal is routed through three inverters and thus exits the prior art driver circuit 102A on the line 112 in its complemented state as the complement signal.

Since a delay is introduced as the signal passes through inverters 202, 204, 206, 208, the extra inverter 208 in the second path results in the truth signal appearing on line 110 slightly earlier than the complement signal appearing on line 112. As a result, when the parasitic capacitances 122, 124 couple the signals on lines 110 and 112 to the bit-line 126, signals on line 110 that transition from logic "0" to logic "1" will affect the bit-line before signals on line 112 that transition from logic "1" to logic "0." Since these effects occur at different times, the noise voltage on bit-line 126 is increased.

Similarly, the driver circuit 102B generates signals through the second path to line 112 in the following manner. If the input signal is a logic "1," then inverter 312 presents a logic "0" to the gate of transistor 308 so that transistor 308 remains off. However, inverter 310 inverts the signal again, and presents a logic "1" to the gate of transistor 306 so that transistor 306 turns on. When transistor 308 is off and transistor 306 is on, ground 318 is connected to line 112. Thus, when the input signal is a logic "1," then a logic "0" will be output on the line 112, and the complement signal is the opposite of the input signal.

If the input signal is a logic "0," then inverter 312 presents a logic "1" to the gate of transistor 308 so that transistor 308 turns on. Inverter 310 inverts the signal again, and presents a logic "0" to the gate of transistor 306 so that transistor 306 remains off. When transistor 308 is on and transistor 306 is off, the power supply voltage 316 is connected to line 112. Thus, when the input signal is a logic "0," then a logic "1" will be output on the line 112 and the complement signal is again the opposite of the input signal.

As evident by the symmetrical nature of the driver circuit 102B, a delay introduced by the first path is substantially equal to a delay introduced by the second path, because the signal is routed through an equal number of circuit components. As a result, the signal appears on line 110 at substantially the same time as the complement of the signal appears on line 112. The term "substantially" is used above in acknowledgment that real world circuits will most likely not have path delays which are perfectly equal. Preferably though, the first and second path delays are as nearly equal as possible, so that the noise voltage on bit-line 126 is minimized.

As a result, when the parasitic capacitances 122, 124 couple the signals on lines 110 and 112 to bit-line 126, signals on line 110 that transition from logic "0" to logic "1" will affect the bit-line at the same time as signals on line 112 that transition from logic "1" to logic "0." Since these effects occur at the same time, the noise voltage on bit-line 126 is reduced since the logic transitions are opposite and thus their effects tend to cancel out.

Figure 3:
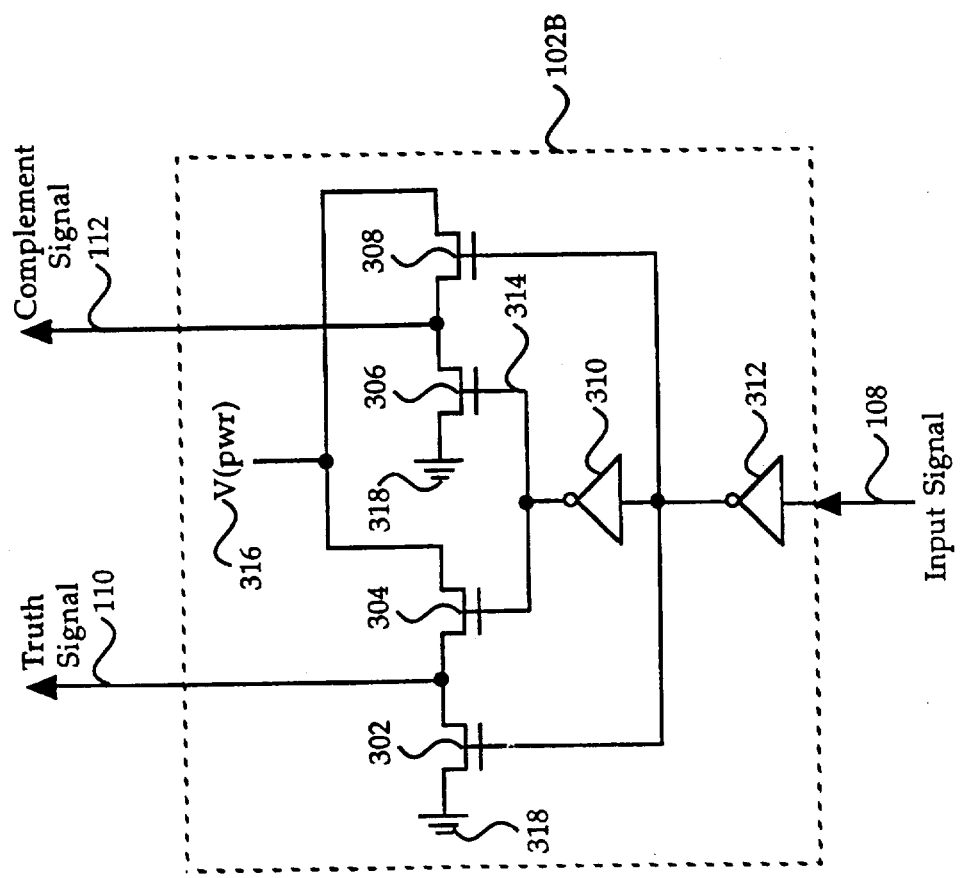
FIG. 3 is a block diagram of a balanced driver circuit in the truth-and-complement circuit of FIG. 1.

FIG. 3 is a block diagram of a balanced driver circuit 102B in the truth-and-complement circuit of FIG. 1. The driver circuit 102B is comprised of four NMOS transistors 302, 304, 306, 308, two inverters 310, 312, a power supply 316, and a ground connection 318. Inverter 312 receives the input signal on line 108 and routes an inverted input signal to inverter 310 and to the gates of transistors 302 and 308. Inverter 310 receives the inverted input signal and routes the non-inverted input signal to the gates of transistors 304 and 306. The inputs of transistors 304 and 308 are coupled to the power supply 316. The outputs of transistors 302 and 306 are coupled to the ground connection 318. Line 110 is coupled to the output of transistor 304 and the input of transistor 302. Line 112 is coupled to the output of transistor 308 and the input of transistor 306.

Signals flow through the driver circuit 102B on one of two paths. A first path routes the input signal on line 108 to line 110. A second path routes the input signal on line 108 to line 112.

The driver circuit 102B generates signals on the first path to line 110 in the following manner. If the input signal is a logic "1," then inverter 312 presents a logic "0" at the gate of transistor 302 so that transistor 302 remains off. However, inverter 310 will invert the signal again, presenting a logic "1" at the gate of transistor 304 so that transistor 304 turns on. When transistor 302 is off and transistor 304 is on, the power supply voltage 316, which is equivalent to a logic "1," is connected to line 110. Thus, when the input signal is a logic "1," then a logic "1" will be output on line 110, and the truth signal is equal to the input signal.

If the input signal is a logic "0," then inverter 312 presents logic "1" at the gate of transistor 302 so that transistor 302 turns on. Inverter 310 inverts the signal again, and presents a logic "0" at the gate of transistor 304 so that transistor 304 remains off. When transistor 302 is on and transistor 304 is off, ground 318, which is equivalent to a logic "0," is connected to line 110. Thus, when the input signal is a logic "0," then a logic "0" will be output on the line 110 and the truth signal again is equal to the input signal.

While the present invention has been described with reference to a preferred embodiment, those skilled in the art will recognize that various modifications may be made. Variations upon and modifications to the preferred embodiment are provided by the present invention, which is limited only by the following claims.

What is claimed is:

1. A balance truth-and-complement circuit comprising:
   means for receiving an input signal;
   means for setting a first output signal on a first output terminal equivalent to the input signal after a first delay; and
   means for setting a second output signal on a second output terminal equivalent to a complement of the input signal after a second delay substantially equal to the first delay further comprising:
   a bit-line; and
   means for selectively coupling either a first circuit selected by the first output signal or a second circuit selected by the second output signal to the bit-line.

2. The circuit of claim 1, further comprising means for detecting signals on the bit-line and amplifying the signals.

3. A balanced truth-and-complement circuit comprising:
   a first circuit having an input terminal coupled to receive an input signal and a first output terminal for providing the input signal as a first output signal, the first circuit introducing a first delay to the input signal as the input signal passes from the input terminal to the first output terminal, the first circuit comprising:
   a first transistor coupled to the input terminal and the first output terminal for connecting a logic "1" signal to the first output terminal when the input signal is set to a logic "1"; and
   a second transistor coupled to the input terminal and the first output terminal for connecting a logic "0" signal to the first output terminal when the input signal is set to a logic "0"; and
   a second circuit having the input terminal coupled to receive the input signal and a second output terminal for providing a complement of the input signal as a second output signal, the second circuit introducing a second delay to the input signal as the input signal passes from the input terminal to the second output terminal, the second delay being substantially equal to the first delay, the second circuit comprising:
   a third transistor coupled to the input terminal and the second output terminal for connecting a logic "0" signal to the second output terminal when the input signal is set to a logic "1";

a fourth transistor coupled to the input terminal and the second output terminal for connecting a logic "1" signal to the second output terminal when the input signal is set to a logic "0";

and further comprising:
a first line coupling the input terminal to the first transistor and introducing a first line delay;
a second line coupling the input terminal to the second transistor and introducing a second line delay;
a third line coupling the input terminal to the third transistor and introducing a third line delay substantially equal to the first line delay; and
a fourth line coupling the input terminal to the fourth transistor and introducing a fourth line delay substantially equal to the second line delay.

4. A balanced truth-and-complement circuit comprising:
a first circuit having an input terminal coupled to receive an input signal and a first output terminal for providing the input signal as a first output signal, the first circuit introducing a first delay to the input signal as the input signal passes from the input terminal to the first output terminal, the first circuit comprising:
a first transistor coupled to the input terminal and the first output terminal for connecting a logic "1" signal to the first output terminal when the input signal is set to a logic "1"; and
a second transistor coupled to the input terminal and the first output terminal for connecting a logic "0" signal to the first output terminal when the input signal is set to a logic "0"; and
a second circuit having the input terminal coupled to receive the input signal and a second output terminal for providing a complement of the input signal as a second output signal, as the input signal passes from the input terminal to the second output terminal, the second delay being substantially equal to the first delay, the second circuit comprising:
a third transistor coupled to the input terminal and the second output terminal for connecting a logic "0" signal to the second output terminal when the input signal is set to a logic "1";
a fourth transistor coupled to the input terminal and the second output terminal for connecting a logic "1" signal to the second output terminal when the input signal is set to a logic "0";
wherein the second transistor and the fourth transistor each have a gate, the circuit further comprising an inverter coupling the gate of the second transistor and the gate of the fourth transistor to the input terminal.

5. A balanced truth-and-complement circuit comprising:
a first circuit having an input terminal coupled to receive an input signal and a first output terminal for providing the input signal as a first output signal, the first circuit introducing a first delay to the input signal as the input signal passes from the input terminal to the first output terminal, the first circuit comprising:
a first transistor coupled to the input terminal and the first output terminal for connecting a logic "1" signal to the first output terminal when the input signal is set to a logic "1"; and
a second transistor coupled to the input terminal and the first output terminal for connecting a logic "0" signal to the first output terminal when the input signal is set to a logic "0"; and
a second circuit having the input terminal coupled to receive the input signal and a second output terminal for providing a complement of the input signal as a second output signal, the second circuit introducing a second delay to the input signal as the input signal passes from the input terminal to the second output terminal, the second delay being substantially equal to the first delay, the second circuit comprising:
a third transistor coupled to the input terminal and the second output terminal for connecting a logic "0" signal to the second output terminal when the input signal is set to a logic "1";
a fourth transistor coupled to the input terminal and the second output terminal for connecting a logic "1" signal to the second output terminal when the input signal is set to a logic "0";
wherein the first transistor and the third transistor each have a gate, the circuit further comprising a pair of inverters coupling in series and coupling the gate of the first transistor and the gate of the third transistor to the input terminal.

6. A balanced truth-and-complement circuit, comprising:
a first circuit having an input terminal coupled to receive an input signal and a first output terminal for providing the input signal as a first output signal, the first circuit introducing a first delay to the input signal as the input signal passes from the input terminal to the first output terminal; and
a second circuit having the input terminal coupled to receive the input signal and a second output terminal for providing a complement of the input signal as a second output signal, the second circuit introducing a second delay to the input signal as the input signal passes from the input terminal to the second output terminal, the second delay being substantially equal to the first delay;
a bit-line; and
a switching circuit coupled to the first output terminal, the second output terminal, and the bit-line for selectively coupling either a first circuit selected by the first output signal or a second circuit selected by the second output signal to the bit-line.

7. The circuit of claim 6, further comprising a sense amplifier coupled to the bit-line for detecting signals on the bit-line and amplifying the signals.

8. A balance truth-and-complement circuit, comprising:
means for receiving an input signal;
means for setting a first output signal on a first output terminal equivalent to the input signal after a first delay comprising:
first means for connecting a logic "1" signal to the first output terminal when the input signal is set to a logic "1";
second means for connecting a logic "0" signal to the first output terminal when the input signal is set to a logic "0" and
means for setting a second output signal on a second output terminal equivalent to a complement of the input signal after a second delay substantially equal to the first delay comprising:
third means for connecting a logic "0" signal to the second output terminal when the input signal is set to a logic "1"; and
fourth means for connecting a logic "1" signal to the second output terminal when the input signal is set to a logic "0";
further comprising:
means for coupling the input signal to the first means after a first line delay;

means for coupling the input signal to the second means after a second line delay;

means for coupling the input signal to the third means after a third line delay substantially equal to the first line delay; and means for coupling the input signal to the fourth means after a fourth line delay substantially equal to the second line delay.

9. A balance truth-and-complement circuit, comprising:

means for receiving an input signal;

means for setting a first output signal on a first output terminal equivalent to the input signal after a first delay comprising:

first means for connecting a logic "1" signal to the first output terminal when the input signal is set to a logic "1";

second means for connecting a "0" signal to the first output terminal when the input signal is set to a logic "0" and means for setting a second output signal on a second output terminal equivalent to a complement of the input signal after a second delay substantially equal to the first delay comprising:

third means for connecting a logic "0" signal to the second output terminal when the input signal is set to a logic "1"; and fourth means for connecting a logic "1" signal to the second output terminal when the input signal is set to a logic "0";

further comprising means for inverting which couples the second means and the fourth means to the input signal.

* * * * *